(12) United States Patent
Kumagai et al.

(10) Patent No.: US 8,847,536 B2
(45) Date of Patent: Sep. 30, 2014

(54) ELECTRIC POWER STEERING APPARATUS

(71) Applicants: Shin Kumagai, Tokyo (JP); Shigeru Fukinuki, Tokyo (JP)

(72) Inventors: Shin Kumagai, Tokyo (JP); Shigeru Fukinuki, Tokyo (JP)

(73) Assignee: NSK Ltd., Tokyo (JP)

( * ) Notice: Subject to any disclaimer, the term of this patent is extended or adjusted under 35 U.S.C. 154(b) by 0 days.

(21) Appl. No.: 14/114,296

(22) PCT Filed: Nov. 15, 2012

(86) PCT No.: PCT/JP2012/079610
§ 371 (c)(1),
(2), (4) Date: Oct. 28, 2013

(87) PCT Pub. No.: WO2013/077241
PCT Pub. Date: May 30, 2013

(65) Prior Publication Data
US 2014/0077741 A1    Mar. 20, 2014

(30) Foreign Application Priority Data

Nov. 21, 2011   (JP) ................................. 2011-254232

(51) Int. Cl.
*H02P 29/02*   (2006.01)
*G01R 31/34*   (2006.01)
*B62D 5/04*    (2006.01)
*H02P 23/00*   (2006.01)

(52) U.S. Cl.
CPC .............. *G01R 31/343* (2013.01); *B62D 5/049* (2013.01); *H02P 23/00* (2013.01)
USPC ............ 318/490; 318/565; 318/434; 318/488

(58) Field of Classification Search
CPC ... H02P 29/021; H02P 29/02; H02P 21/0035; H02P 29/022; H02P 29/027; H02P 6/002
USPC ......... 318/563–565, 430–434, 450, 452–454, 318/474, 476, 478, 488, 489, 490
See application file for complete search history.

(56) References Cited

U.S. PATENT DOCUMENTS

| 7,098,652 | B2 * | 8/2006 | Bolz ......................... 324/207.15 |
| 2003/0038637 | A1 * | 2/2003 | Bertness et al. .............. 324/426 |
| 2005/0156548 | A1 |  7/2005 | Kawada |

FOREIGN PATENT DOCUMENTS

| JP | 3-139193 A | 6/1991 |
| JP | 11-252974 A | 9/1999 |

(Continued)

OTHER PUBLICATIONS

Japanese Office Action dated Feb. 5, 2013 issued in a corresponding Japanese Patent Application No. 2011-254232.

*Primary Examiner* — Bentsu Ro
(74) *Attorney, Agent, or Firm* — Sughrue Mion, PLLC

(57) ABSTRACT

An electric power steering apparatus includes a shunt resistor connected to an inverter, a controlling motor current detection circuit connected to two terminals of the shunt resistor in a positive direction, which detects phase currents of a motor and uses the detected phase current as a controlling motor current detection value of assist control, and a diagnostic motor current detection circuit that is connected to two terminals of the shunt resistor in an opposite direction and detects a failure of the controlling motor current detection circuit. Each phase current of the motor is detected by one-shunt type and the assist control is performed, and two systems of a circuit for amplifying a voltage between two terminals of the shunt resistor are provided.

13 Claims, 8 Drawing Sheets

(56) References Cited

FOREIGN PATENT DOCUMENTS

| | | |
|---|---|---|
| JP | 2003-59636 A | 2/2003 |
| JP | 2006-137280 A | 6/2006 |
| JP | 2009-131064 A | 6/2009 |
| JP | 2009-232569 A | 10/2009 |
| JP | 2011-130616 A | 6/2011 |
| WO | 03/078237 A1 | 9/2003 |

* cited by examiner

PRIOR ART

PRIOR ART

PRIOR ART

PRIOR ART

ELECTRIC POWER STEERING APPARATUS

CROSS REFERENCE TO RELATED APPLICATIONS

This application is a National Stage of International Application No. PCT/JP2012/079610, filed on Nov. 15, 2012, which claims priority from Japanese Patent Application No. 2011-254232, filed on Nov. 21, 2011, the contents of all of which are incorporated herein by reference in their entirety.

TECHNICAL FIELD

The present invention relates to an electric power steering apparatus that a steering assist torque is applied to a steering system of a vehicle by means of a multi-phase motor drive-controlled by PWM duty command values, and in particular to a high-performance electric power steering apparatus that enhances safety by equipping a single current detection circuit (one-shunt type current detection circuit) between a driving section that PWM-drives and a power supply (a battery) to assist-control and simultaneously diagnosing failures and troubles of the current detection circuit and so on.

BACKGROUND ART

An electric power steering apparatus that assist-controls a steering system of a vehicle by using a rotational torque of a motor, applies a driving force of the motor as a steering assist torque to a steering shaft or a rack shaft by means of a transmission mechanism such as gears or a belt through a reduction mechanism. And then, in order to supply a current to the motor so that the motor generates a desired torque, an inverter is used in a motor drive circuit.

A general configuration of a conventional electric power steering apparatus will be described with reference to FIG. 1. As shown in FIG. 1, a column shaft (a steering shaft) 2 connected to a steering wheel (handle) 1, is connected to steered wheels 8L and 8R through reduction gears 3, universal joints 4a and 4b, a rack and pinion mechanism 5, and tie rods 6a and 6b, further via hub units 7a and 7b. Further, the column shaft 2 is provided with a torque sensor 10 for detecting a steering torque of the steering wheel 1, and a motor 20 for assisting the steering force of the steering wheel 1 is connected to the column shaft 2 through the reduction gears 3. Electric power is supplied to a control unit (an ECU) 100 for controlling the electric power steering apparatus from a battery 13, and an ignition key signal is inputted into the control unit 100 through an ignition key 11. The control unit 100 calculates a current command value of an assist (steering assist) command based on a steering torque T detected by the torque sensor 10 and a velocity Vs detected by a velocity sensor 12, and controls a current I supplied to the motor 20 based on a voltage command value E obtained by performing compensation and so on with respect to the current command value in a current control section. Furthermore, it is also possible to receive the velocity Vs from a CAN (Controller Area Network) and so on.

The control unit 100 mainly comprises a CPU (or an MPU or an MCU), and general functions performed by programs within the CPU are shown in FIG. 2.

Functions and operations of the control unit 100 will be described with reference to FIG. 2. As shown in FIG. 2, the steering torque T detected by the torque sensor 10 and the velocity Vs detected by the velocity sensor 12 are inputted into a current command value calculating section 101. The current command value calculating section 101 decides a current command value Iref1 that is the desired value of the current supplied to the motor 20 such as a three-phase motor based on the steering torque T and the velocity Vs and by means of an assist map and so on. The current command value Iref1 is added in an addition section 102A and then the added value is inputted into a current limiting section 103 as a current command value Iref2. A current command value Iref3 that is limited the maximum current, is inputted into a subtraction section 102B, and a deviation Iref4 (=Iref3−Im) between the current command value Iref3 and a motor current value Im that is fed back, is calculated. The deviation Iref4 is inputted into a current control section 104 that performs PI control and so on. The voltage command value E that characteristic improvement is performed in the current control section 104, is inputted into a PWM control section 105. Furthermore, the motor 20 is PWM-driven through an inverter 106 serving as a drive section. The current value Im of the motor 20 is detected by a current detection circuit 120 within the inverter 106 and is fed back to the subtraction section 102B. In general, the inverter 106 uses EFTs as switching elements and is comprised of a bridge circuit of FETs.

Further, a compensation signal CM from a compensation section 110 is added in the addition section 102A, and the compensation of the system is performed by the addition of the compensation signal CM so as to improve a convergence, an inertia characteristic and so on. The compensation section 110 adds a self-aligning torque (SAT) 113 and an inertia 112 in an addition section 114, further adds the result of addition performed in the addition section 114 and a convergence 111 in an addition section 115, and then outputs the result of addition performed in the addition section 115 as the compensation signal CM.

In a case that the motor 20 is a 3-phase (U-phase, V-phase and W-phase) brushless motor, details of the PWM control section 105 and the inverter 106 is a configuration such as shown in FIG. 3. The PWM control section 105 comprises a duty calculating section 105A that calculates PWM duty command values D1~D6 of three phases according to a given expression based on the voltage command value E, and a gate driving section 105B that switches ON/OFF after driving each gate of FET1~FET6 by the PWM duty command values D1~D6. The inverter 106 comprises a three-phase bridge having top and bottom arms comprised of an upper-FET1 and a lower-FET4 of U-phase, top and bottom arms comprised of an upper-FET2 and a lower-FET5 of V-phase, and top and bottom arms comprised of an upper-FET3 and a lower-FET6 of W-phase, and drives the motor 20 by being switched ON/OFF based on the PWM duty command values D1~D6.

In such a configuration, although it is necessary to measure a drive current of the inverter 106 or a motor current of the motor 20, as one of request items of downsizing, weight saving and cost-cutting of the control unit 100, it is singulation of the current detector 120 (one-shunt type current detection circuit). A one-shunt type current detection circuit is known as the singulation of a current detection circuit, and for example, the configuration of the one-shunt type current detection circuit 120 is shown in FIG. 4 (Japanese Published Unexamined Patent Application No. 2009-131064 A). That is to say, a one-shunt resistor R1 is connected between the bottom arm of the FET bridge and ground (GND), a fall voltage that is caused by the shunt resistor R1 when a current flowed in the FET bridge, is converted into a current value Ima by an operational amplifier (a differential amplifying circuit) 121 and resistors R2~R4, and further an A/D converting section 122 A/D-converts the current value Ima at a given timing via a filter comprised of a resistor R6 and a capacitor C1 and then outputs a current value Im that is a digital value. Moreover, a reference voltage of "2.5V" is connected to a positive terminal input of the operational amplifier 121 via a resistor R5.

FIG. 5 shows a wiring diagram of a power supply (a battery), the inverter 106, the current detection circuit 120 and the motor 20, and simultaneously shows a current pathway (indicated by a dashed line) during a state that the upper-FET1 of U-phase is turned ON (the lower-FET4 of U-phase is turned OFF), the upper-FET2 of V-phase is turned OFF (the lower-FET5 of V-phase is turned ON), and the upper-FET3 of W-phase is turned OFF (the lower-FET6 of W-phase is turned ON). Further, FIG. 6 shows a current pathway (indicated by a dashed line) during a state that the upper-FET1 of U-phase is turned ON (the lower-FET4 of U-phase is turned OFF), the upper-FET2 of V-phase is turned ON (the lower-FET5 of V-phase is turned OFF), and the upper-FET3 of W-phase is turned OFF (the lower-FET6 of W-phase is turned ON). It is clear from these current pathways of FIG. 5 and FIG. 6 that the total value of phases that the upper-FET is turned ON, appears in the current detection circuit 120 as a detected current. That is, it is possible to detect a U-phase current in FIG. 5, and it is possible to detect the U-phase current and a V-phase current in FIG. 6. This is the same as in the case that the current detection circuit 120 is connected between the top arm of the inverter 106 and the power supply.

THE LIST OF PRIOR ART DOCUMENTS

Patent Documents

Patent Document 1: Japanese Published Unexamined Patent Application No. 2009-131064 A
Patent Document 2: Japanese Published Unexamined Patent Application No. 2009-232569 A

SUMMARY OF THE INVENTION

Problems to be Solved by the Invention

In this way, although a conventional device (for example, Japanese Published Unexamined Patent Application No. 2009-131064 A) is provided with a current detection circuit, since no measures in the case that failures (including troubles) of the current detection circuit occur, are taken, from the aspect of safety improvement of the steering system, implementation of measures against failures is strongly requested.

Further, on the other hand, in order to detect an overcurrent failure due to a short fault of FET(s) within the inverter, a circuit that performs a peak-hold by means of a diode disposed so as to follow the current detection circuit, is proposed (Japanese Published Unexamined Patent Application No. 2009-232569 A). However, in the case that a capacitor for charge and discharge is charged by an output voltage of the operational amplifier via the diode, since a charging current to the capacitor becomes a load current of the operational amplifier, when the charging current (the load current) is large, there is a problem that responsiveness of the operational amplifier decreases and the detection accuracy of the current detection circuit and the peak-hold circuit degrades.

The present invention has been developed in view of the above-described circumstances, and an object of the present invention is to provide an electric power steering apparatus that further enhances safety by detecting each-phase currents of a motor by means of a one-shunt type current detection circuit and at the same time, certainly performing diagnosis of failures and troubles of the current detection circuit by means of a simplified constitution.

Means for Solving the Problems

The present invention relates to an electric power steering apparatus that calculates a current command value based on a steering torque and a velocity, drives a motor having a plurality of phases based on said current command value through an inverter comprised of an FET bridge, and performs an assist control of a steering system by drive control of said motor, the above-described object of the present invention is achieved by that comprising: a shunt resistor that is connected to said inverter; a controlling motor current detection circuit that is connected to two terminals of said shunt resistor in a positive direction, detects phase currents of said motor and uses said detected phase current as a controlling motor current detection value of said assist control; and a diagnostic motor current detection circuit that is connected to two terminals of said shunt resistor in an opposite direction and detects a failure of said controlling motor current detection circuit, wherein each phase current of said motor is detected by one-shunt type and said assist control is performed, and two systems of a circuit for amplifying a voltage between two terminals of said shunt resistor are provided.

Further, the above-described object of the present invention is more effectively achieved by that wherein by comparing a controlling motor current detection value detected by said controlling motor current detection circuit with a diagnostic motor current detection value detected by said diagnostic motor current detection circuit, it is detected that a failure of either one of said controlling motor current detection circuit and said diagnostic motor current detection circuit occurs; or wherein comprising: a maximum current detection circuit that is connected to an output stage of said diagnostic motor current detection circuit, wherein said maximum current detection circuit holds a peak of a diagnostic motor current detection voltage outputted from said diagnostic motor current detection circuit during a constant time; or wherein said maximum current detection circuit is comprised of a transistor for a peak-hold, and a resistor and a capacitor that generate a charge/discharge time constant, wherein an output of said diagnostic motor current detection is inputted into a base of said transistor and a charging resistor is inserted between an emitter of said transistor, and said resistor and said capacitor; or wherein by comparing a maximum current detection value detected by said maximum current detection circuit, said controlling motor current detection value detected by said controlling motor current detection circuit, and said diagnostic motor current detection value detected by said diagnostic motor current detection circuit, a diagnosis of a failure or a trouble of either one of said controlling motor current detection circuit, said diagnostic motor current detection circuit, and said maximum current detection circuit is made; or wherein said diagnostic motor current detection circuit is constituted so that an output voltage of said diagnostic motor current detection circuit increases in accordance with a magnitude of a current when flowing from a power supply side to a ground side based on a voltage when said current which flows through said shunt resistor is zero; or wherein said controlling motor current detection circuit is constituted so that an output voltage of said controlling motor current detection circuit decreases in accordance with a magnitude of a current when flowing from a power supply side to a ground side based on a voltage when said current which flows through said shunt resistor is zero; or wherein a sum of a controlling motor current detection voltage detected by said controlling motor current detection circuit and said diagnostic motor current detection voltage detected by said diagnostic motor current detection circuit becomes a constant voltage regardless of said current at a time of being normal.

Effects of the Invention

According to the present invention, while using an inexpensive one-shunt type current detection circuit (a controlling motor current detection circuit), since a diagnostic motor current detection is comprised of an operational amplifier (a differential amplifying circuit), a maximum current detection circuit is comprised of a transistor for a peak-hold, and resistors and capacitors that generate charge/discharge time constants, and then by inputting an output of the operational amplifier of the diagnostic motor current detection into base of the transistor and connecting the charge/discharge capacitors to emitter of the transistor through the charging resistors, it is possible to make the load current of the operational amplifier smaller while having the peak-hold function that is the same function as the case of using a diode (Patent Document 2), it is possible to prevent reduced output response caused by output load current of the operational amplifier, and it is possible to prevent degradation of the detection accuracy of the current detection circuit.

Further, according to the present invention, by comparing a controlling motor current detection value detected by the controlling motor current detection circuit with a diagnostic motor current detection value detected by the diagnostic motor current detection circuit, it is possible to detect that the failure of either one of two motor current detection circuits occurs. Since the maximum current detection circuit that holds a peak of a diagnostic motor current detection voltage outputted from the diagnostic motor current detection circuit during a constant time, is connected to the output stage of the diagnostic motor current detection circuit, by monitoring a maximum current detection value, it is possible to detect an overcurrent failure such as a short fault of the FET within the inverter. Moreover, according to the present invention, since it is possible to detect that the failure of either circuit occurs by comparing the maximum current detection value detected by the maximum current detection circuit with the controlling motor current detection value and the diagnostic motor current detection value, it is also possible to continue the assist control depending on determination of failure position.

MODE FOR CARRYING OUT THE INVENTION

Figure 1:
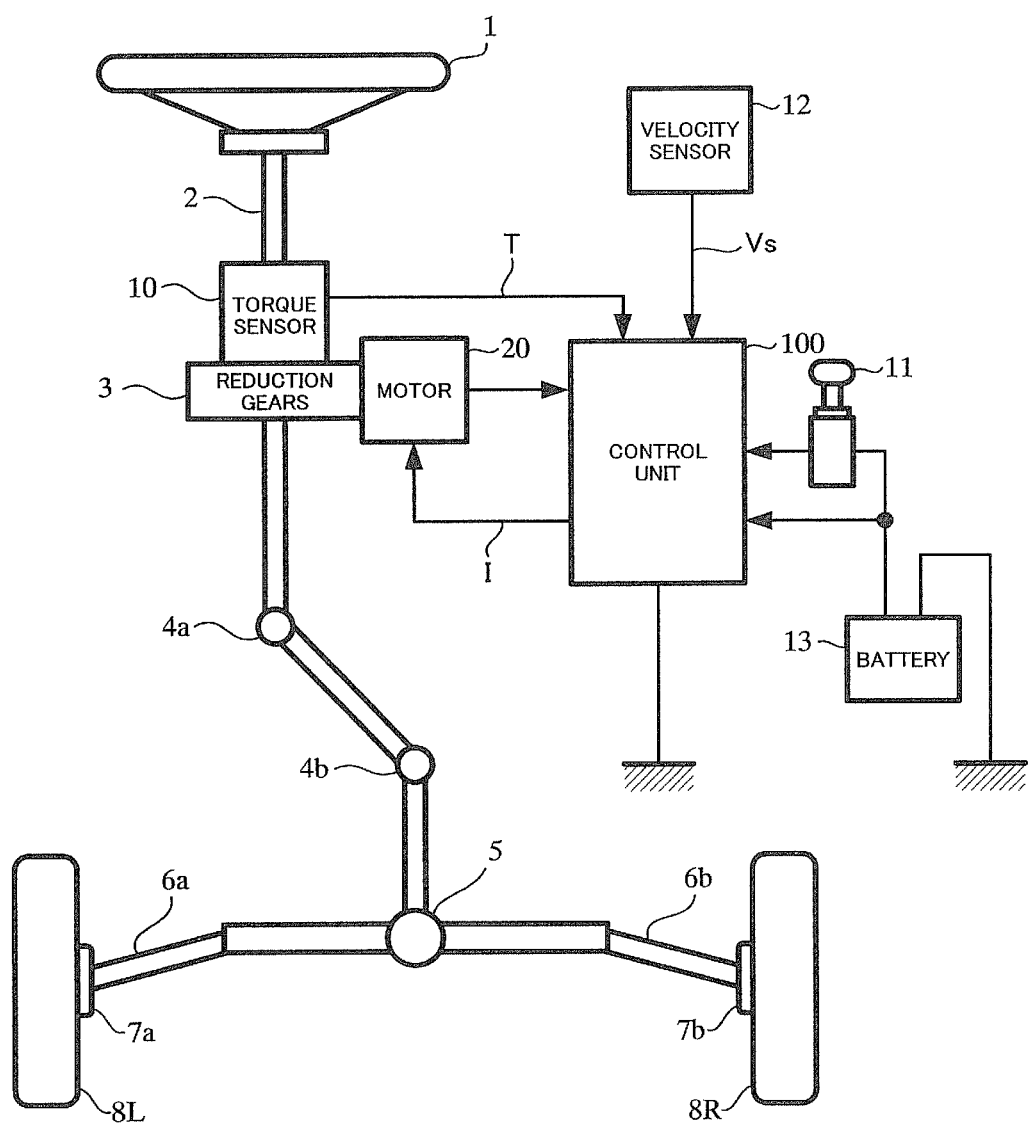
FIG. 1 is a diagram showing a configuration example of a general electric power steering apparatus.
Figure 2:
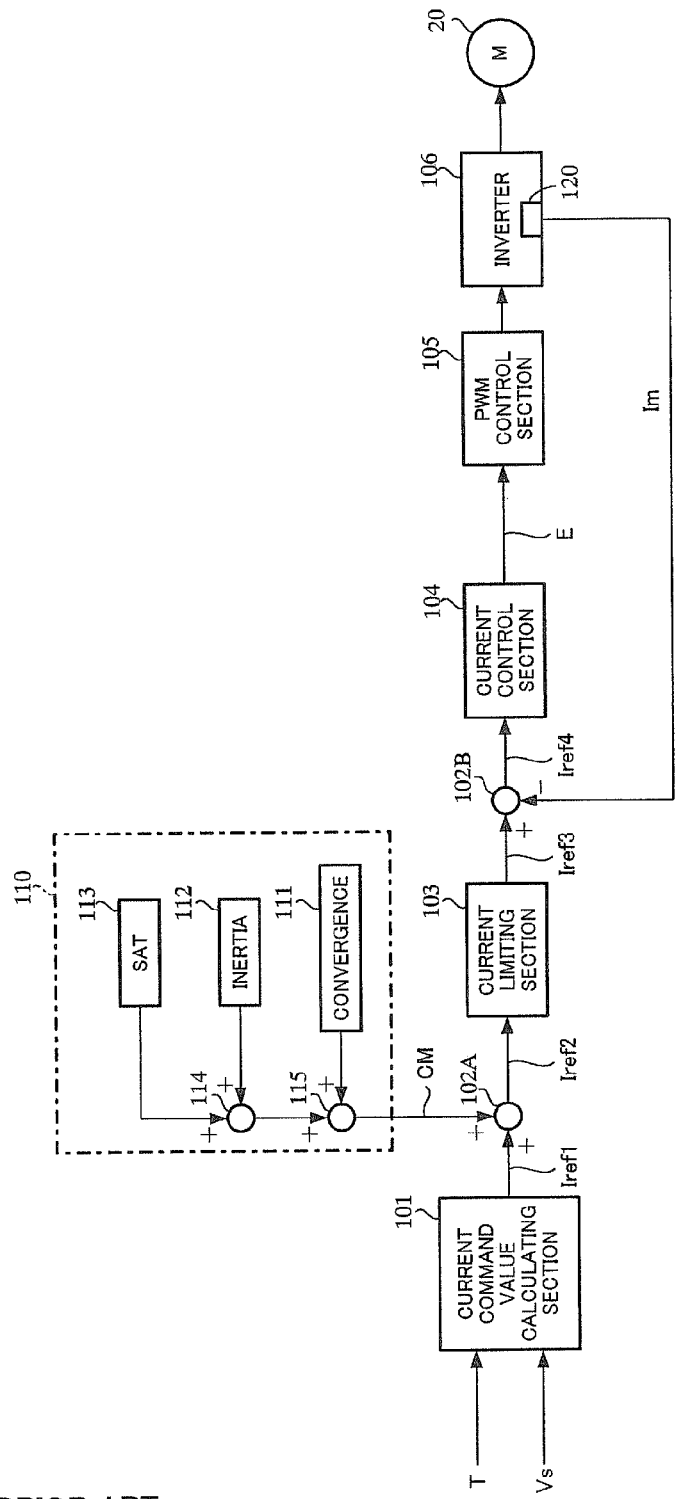
FIG. 2 is a block diagram showing one example of a control unit.
Figure 3:
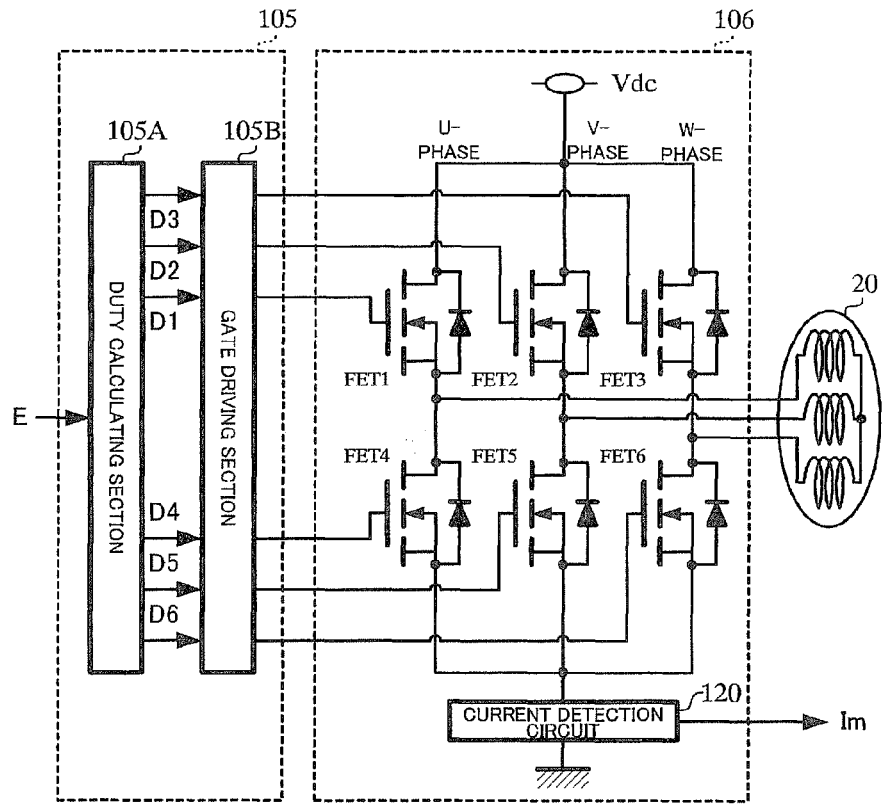
FIG. 3 is a wiring diagram showing a configuration example of a PWM control section and an inverter.

The present invention is a current detection circuit for detecting a motor current from a voltage between two terminals of a shunt resistor that the shunt resistor is connected between an inverter and ground (GND), a circuit for amplifying the voltage between two terminals of the shunt resistor comprises two circuits of a controlling motor current detection circuit used for motor control and a diagnostic motor current detection circuit for detecting failures (including troubles) of the controlling motor current detection circuit, and the failure of the controlling motor current detection circuit is detected by comparing a controlling motor current detection value detected by the controlling motor current detection circuit with a diagnostic motor current detection value detected by the diagnostic motor current detection circuit.

The diagnostic motor current detection circuit is constituted so that an output voltage of the diagnostic motor current detection circuit increases in accordance with the magnitude of a current when flowing from a power supply side to a ground (GND) side based on a voltage when the current which flows through the shunt resistor is zero, further a maximum current detection circuit that holds a peak of a diagnostic motor current detection voltage outputted from the diagnostic motor current detection circuit during a constant time is connected to the output stage of the diagnostic motor current detection circuit, and an overcurrent failure such as a short fault of FET(s) within the inverter is detected by monitoring a maximum current detection value.

Further, the controlling motor current detection circuit is constituted so that an output voltage of the controlling motor current detection circuit decreases in accordance with the magnitude of the current when flowing from the power supply side to the ground side based on the voltage when the current which flows through the shunt resistor is zero, being constituted so that a sum of a controlling motor current detection voltage detected by the controlling motor current detection circuit and the diagnostic motor current detection voltage detected by the diagnostic motor current detection circuit becomes a constant voltage regardless of current at the time of being normal, and a trouble such as a situation that a normal voltage can not be outputted due to a failure of the controlling motor current detection voltage or the diagnostic motor current detection voltage, is detected by monitoring a motor current detection voltage sum that is the sum of the controlling motor current detection voltage and the diagnostic motor current detection voltage.

Moreover, according to the present invention, by comparing the maximum current detection value detected by the maximum current detection circuit with the controlling motor current detection value and the diagnostic motor current detection value, it is possible to detect that the failure of either circuit occurs, and it is possible to further enhance safety of an electric power steering apparatus.

Hereinafter, embodiments of the present invention will be described in detail with reference to the accompanying drawings.

Figure 4:
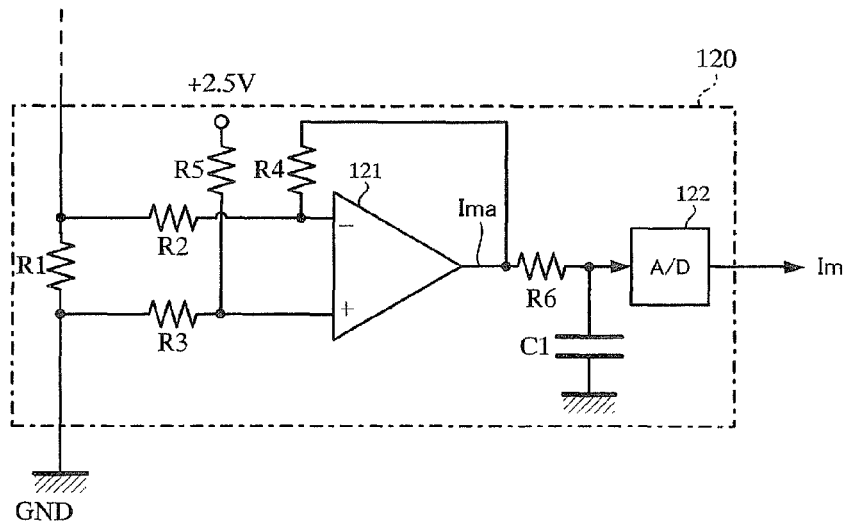
FIG. 4 is a wiring diagram showing a configuration example of a one-shunt type current detector.
Figure 5:
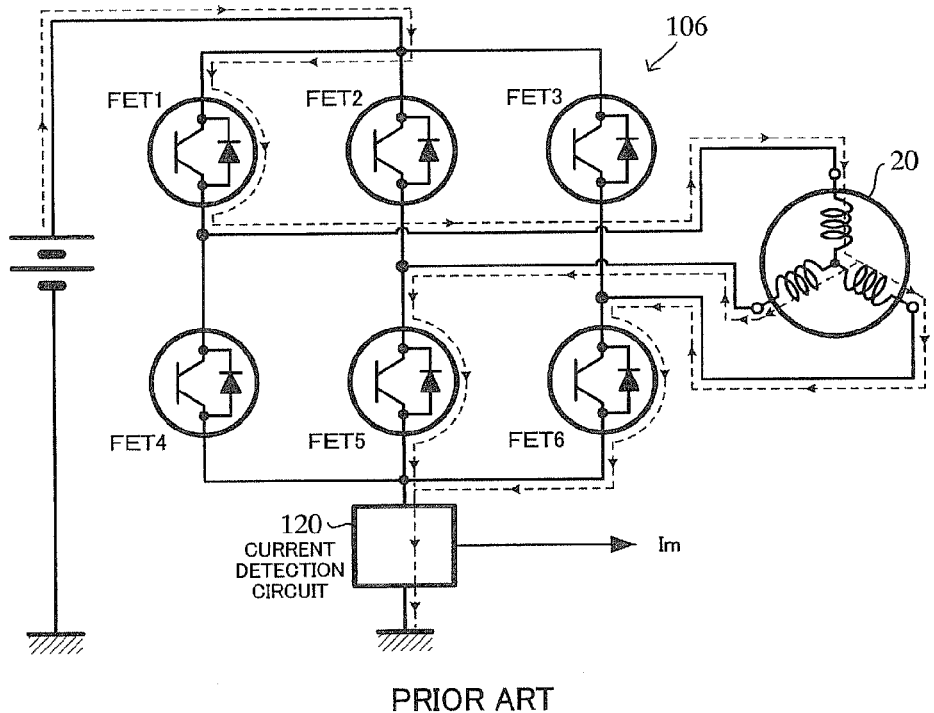
FIG. 5 is a current pathway diagram showing one operation example of an inverter equipped with a one-shunt type current detector.
Figure 6:
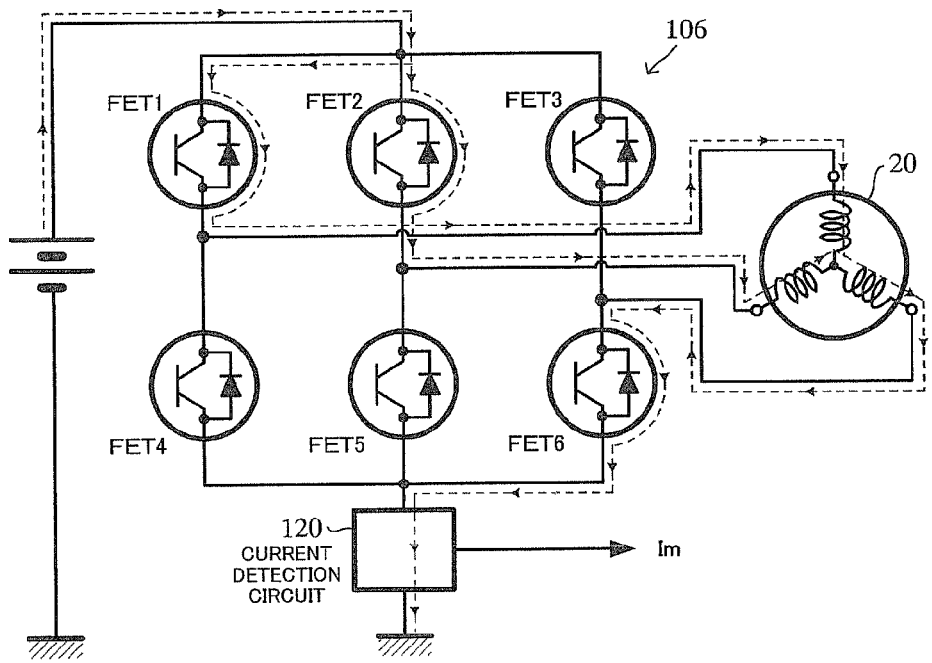
FIG. 6 is a current pathway diagram showing another operation example of the inverter equipped with the one-shunt type current detector.
Figure 7:
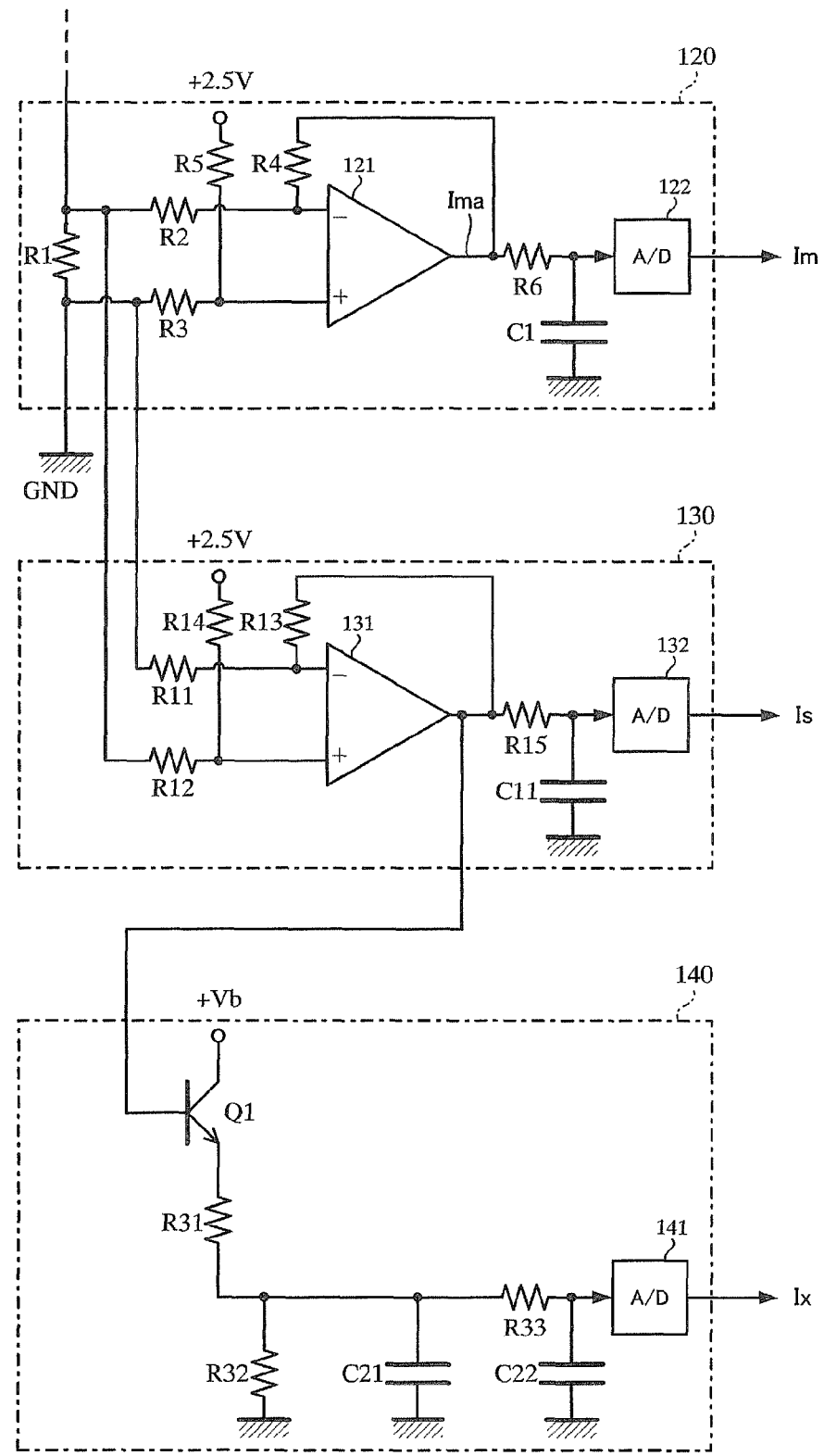
FIG. 7 is a wiring diagram showing a configuration example of the present invention.

FIG. 7 shows a configuration example of the present invention corresponding to FIG. 4, in the present invention, the current detection circuit 120 of FIG. 4 functions as the controlling motor current detection circuit, the controlling motor current detection circuit 120 is connected to two terminals of the shunt resistor R1, further, a diagnostic motor current detection circuit 130 is connected to two terminals of the shunt resistor R1, and a maximum current detection circuit 140 is connected to the output stage of the diagnostic motor current detection circuit 130.

The controlling motor current detection circuit 120 is comprised of the operational amplifier (the differential amplifying circuit) 121, and in the case that the voltage when the current which flows through the shunt resistor R1 is zero becomes 2.5V and setting a current when flowing from the power supply side to the ground side as a positive current, when the positive current flows, the output voltage of the controlling motor current detection circuit 120 decreases from "2.5V" in accordance with the magnitude of the positive current. For example, in the case that a current of "100 A" flows to a positive direction, the output voltage decreases "2V" with respect to the voltage of "2.5V" and becomes "0.5V", and in the case that a current of "100 A" flows to a negative direction, the output voltage decreases "2V" with respect to the voltage of "2.5V" and becomes "0.5V". The controlling motor current detection voltage detected by the controlling motor current detection circuit 120, is converted to a physical value Im after an A/D conversion performed by the A/D conversion section 122 by means of a CPU (including an MCU or the like) in an arbitrary timing, and used for controlling the motor current.

The diagnostic motor current detection circuit 130 is comprised of an operational amplifier (a differential amplifying circuit) 131, and in the case that the voltage when the current which flows through the shunt resistor R1 is zero becomes "2.5V" and setting a current when flowing from the power supply side to the ground side as a positive current, when the positive current flows, the output voltage of the diagnostic motor current detection circuit 130 (an output of the operational amplifier 131) increases from "2.5V" in accordance with the magnitude of the positive current. For example, in the case that a current of "100 A" flows to the positive direction, the output voltage decreases "2V" with respect to the voltage of "2.5V" and becomes "0.5V", and in the case that a current of "100 A" flows to the negative direction, the output voltage increases "2V" with respect to the voltage of "2.5V" and becomes "1.0V". The diagnostic motor current detection voltage detected by the diagnostic motor current detection circuit 130, is converted to a physical value Is after an A/D conversion performed by an A/D conversion section 132 by means of a CPU (including an MCU or the like) in an arbitrary timing, and used for detecting an abnormality of the controlling motor current detection value.

Moreover, an upper voltage of the shunt resistor R1 is inputted into a negative input terminal of the operational amplifier 121 of the controlling motor current detection circuit 120 via the input resistor R2 (the positive direction), and a lower voltage of the shunt resistor R1 is inputted into a negative input terminal of the operational amplifier 131 of the diagnostic motor current detection circuit 130 via an input resistor R11 (an opposite direction).

The maximum current detection circuit 140 comprises a transistor Q1, a charge/discharge capacitor C21, a charging resistor R31 and a discharging resistor R32, and in the case (at the time of charging) that the voltage of the charge/discharge capacitor C21 is smaller than a voltage that decreases the base-emitter voltage Vbe of the transistor Q1 with respect to the output voltage of the diagnostic motor current detection circuit 130 (the output of the operational amplifier 131), the charge/discharge capacitor C21 is charged in accordance with a time constant of the charging resistor R31 and the charge/discharge capacitor C21 so as to become the voltage that decreases the base-emitter voltage Vbe of the transistor Q1 with respect to the output voltage of the diagnostic motor current detection circuit 130. In the case (at the time of discharging) that the voltage of the charge/discharge capacitor C21 is larger than the voltage that decreases the base-emitter voltage Vbe of the transistor Q1 with respect to the output voltage of the diagnostic motor current detection circuit 130, the charge/discharge capacitor C21 is discharged in accordance with a time constant of the discharging resistor R32 and the charge/discharge capacitor C21.

A resistor R33 and a capacitor C22 comprise a filter, and an output of the filter that noises are removed is A/D-converted by an A/D conversion section 141 and then is outputted as a digital value Ix.

In the case of a peak-hold circuit using a diode as shown in Patent Document 2, since it is a configuration that the charge/discharge capacitor is charged by the output voltage of the operational amplifier through the diode, the charging current with "mA" order to the capacitor becomes the load current of the operational amplifier, hence there is a possibility that the responsiveness of the operational amplifier decreases and the detection accuracy of the current detection circuit and the peak-hold circuit degrades. On the other hand, in the case of a configuration shown in the present invention that inputs the output of the operational amplifier by means of the base of the transistor, since it is possible to reduce the load current to "μA" order, it is possible to avoid an effect on the responsiveness of the operational amplifier.

Further, the maximum current detection circuit 140 is constituted so as to peak-hold the output voltage of the diagnostic motor current detection circuit 130 by means of the discharging resistor R32 and the charge/discharge capacitor C21. Since the maximum current detection circuit 140 is a circuit that peak-holds the positive current when the current flowing through the shunt resistor R1 flows from the power supply side of the inverter to the ground side, not only detecting an overcurrent due to a short circuit of valve arm of the inverter, but also holding a peak of an instantaneous ("50 μs" or less) and intermittent (20 KHz period) overcurrent that occurs in the case that for example, a short fault of the lower-FET occurs and the upper-FET PWM-drives by 20 kHz during a constant time. The peak-held voltage is converted to the physical value (Ix) after an A/D conversion performed by the A/D conversion section 141 by means of a CPU in an arbitrary timing, and used for abnormality diagnosis of the maximum current and failure diagnosis of the controlling motor current detection circuit 120 and the diagnostic motor current detection circuit 130.

In view of the above-described circumstances, it is preferred that the charge/discharge time constant generated by the resistor R32 and the capacitor C21 has a "μs" order, and it is preferred that the discharge time constant has a range from "200 μs" to "1 ms" that is capable of certainly holding the peak value during "50 μs".

Figure 8:
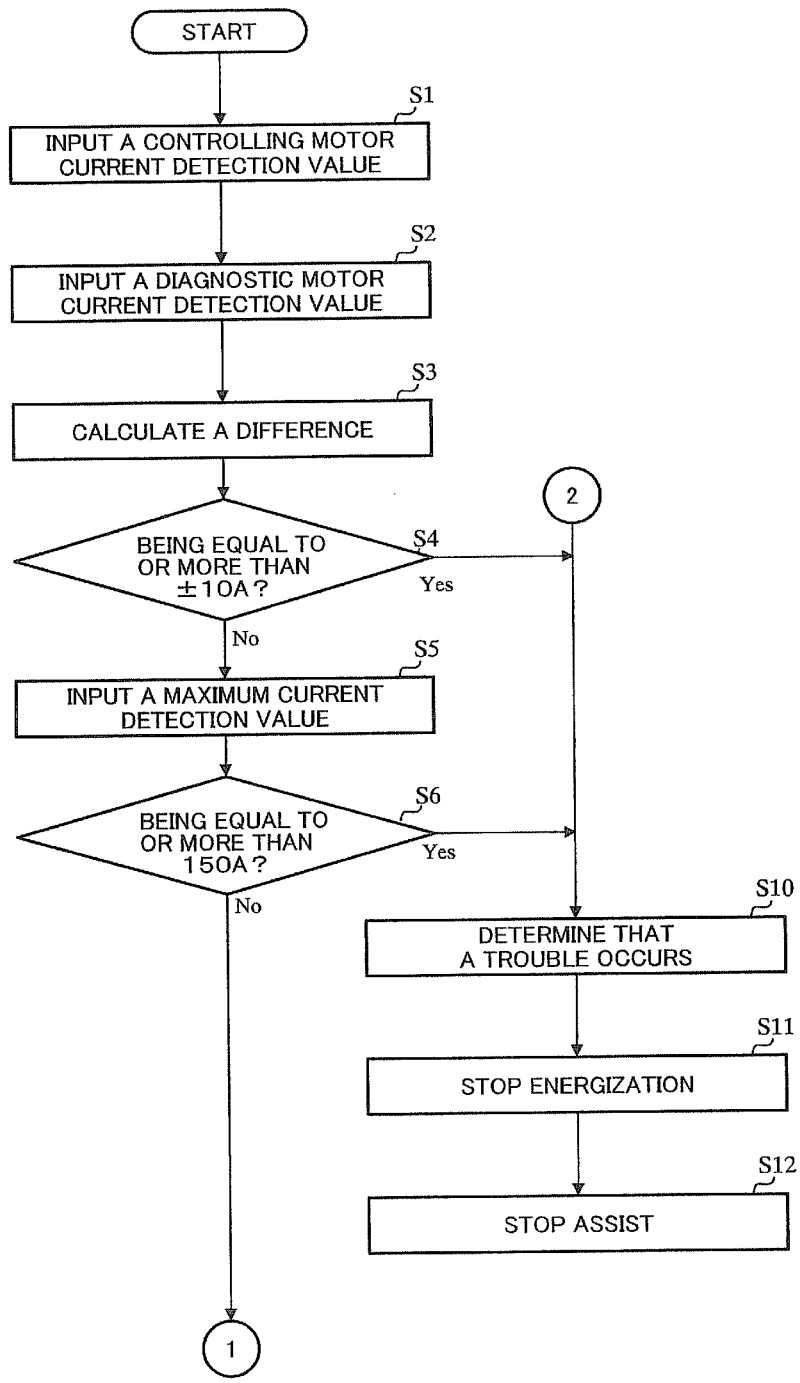
FIG. 8 is apart of a flow chart showing an operation example of the present invention.
Figure 9:
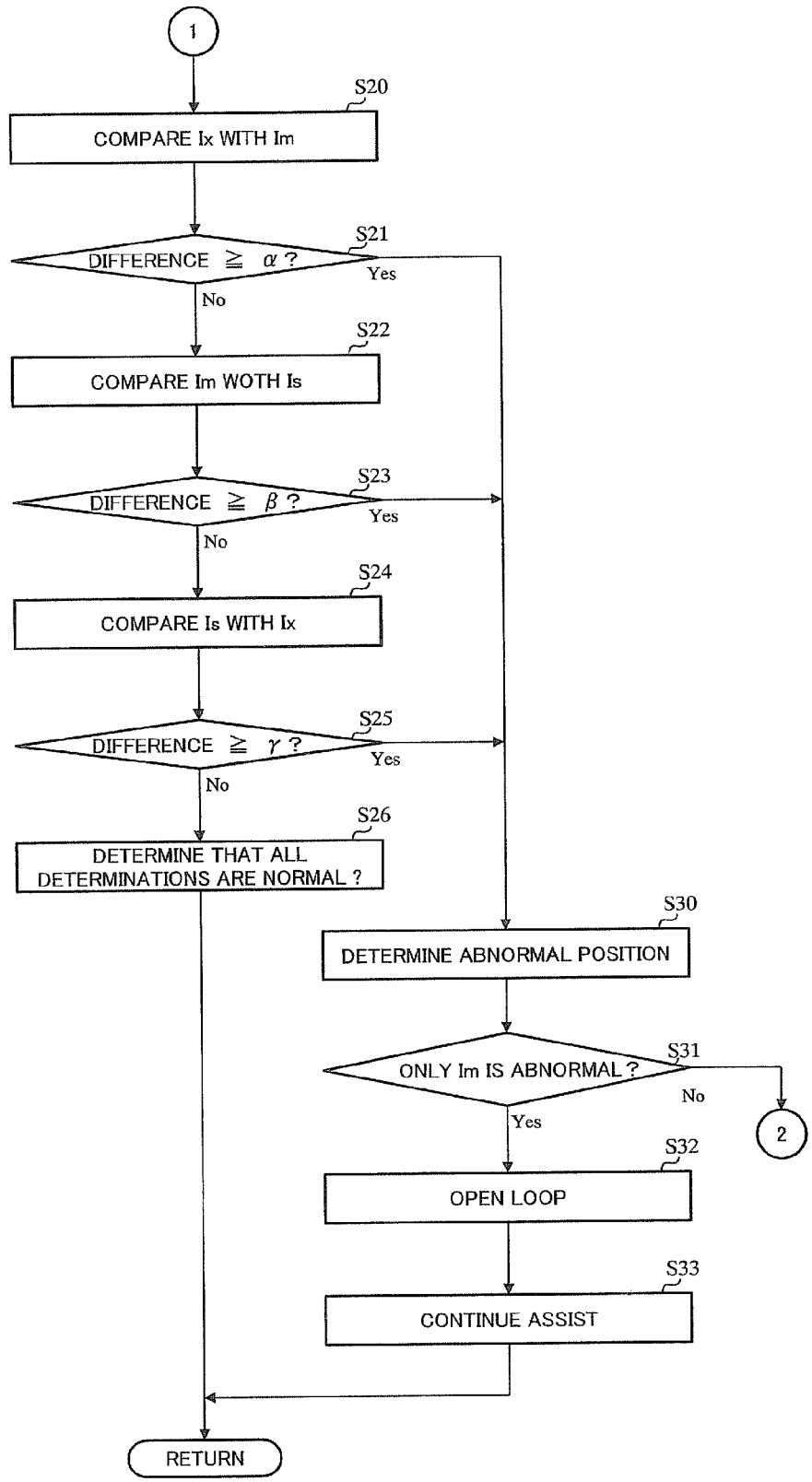
FIG. 9 is apart of a flow chart showing an operation example of the present invention.

In such a configuration, an operation example of the present invention will be described with reference to flow charts of FIG. 7 and FIG. 8.

At first, the controlling motor current detection value Im is inputted (Step S1) and then the diagnostic motor current detection value Is is inputted (Step S2). It is possible to reverse input order of the controlling motor current detection value Im and the diagnostic motor current detection value Is. Although the controlling motor current detection value Im and the diagnostic motor current detection value Is indicate the same current detection value in the case of normality, when failures such as a failure that offset voltage of the controlling motor current detection circuit 120 or the diagnostic motor current detection circuit 130 varies and a failure (including a trouble) that a gain of the controlling motor current detection circuit 120 or the diagnostic motor current detection circuit 130 varies occur, a difference occurs between the controlling motor current detection value Im and the diagnostic motor current detection value Is. Hence, a difference between the controlling motor current detection value Im and the diagnostic motor current detection value Is is calculated (Step S3), it is determined whether the difference is equal to or more than a given value, for example, "±10 A" or not (Step S4), and if the difference is equal to or more than "±10 A", it is determined that a trouble (including a failure) occurs (step S10).

In the case of determining that a trouble occurs, an energization to the inverter is stopped (Step S11), and then the assist control is stopped (Step S12).

On the other hand, in the above Step S4, in the case of determining that the difference is smaller than ±10 A, further the maximum current detection value Ix detected by the maximum current detection circuit 140 is inputted to monitor (Step S5), and it is determined whether the maximum current detection value Ix is equal to or more than a given value, for example, "150 A" or not (Step S6). In the case that the maximum current detection value Ix is equal to or more than "150 A", it is determined that an overcurrent failure of the inverter (for example, a short fault of the FET) occurs and a trouble (including a failure) is detected (Step s10), and in the same way as the above, the energization to the inverter is stopped (Step S11), and then the assist control is stopped (Step S12).

In the case that the maximum current detection value Ix is smaller than "150 A", further the following diagnosis is performed. That is to say, since the maximum current detection value Ix, the controlling motor current detection value Im and the diagnostic motor current detection value Is are correlated with each other in detecting the current flowing through the shunt resistor R1, by comparing each of the current detection values, it is possible to diagnose which current detection circuit a failure occurs in. Concretely, the following determinations (a), (b) and (c) are performed by comparing the current detection values, and cases that there is a difference equal to or more than a given value respectively are determine as abnormality, and cases except for the cases that there is a difference equal to or more than a given value respectively are determined as normality.

Determination (a): a comparison of the maximum current detection value Ix and the controlling motor current detection value Im, that is to say, a difference between the maximum current detection value Ix and the controlling motor current detection value Im is calculated (Step S20), and then it is determined whether the difference between the maximum current detection value Ix and the controlling motor current detection value Im is equal to or more than a given value α or not (Step s21).

Determination (b): a comparison of the controlling motor current detection value Im and the diagnostic motor current detection value Is, that is to say, a difference between the controlling motor current detection value Im and the diagnostic motor current detection value Is is calculated (Step S22), and then it is determined whether the difference between the controlling motor current detection value Im and the diagnostic motor current detection value Is is equal to or more than a given value β or not (Step s21).

Determination (c): a comparison of the diagnostic motor current detection value Is and the maximum current detection value Ix, that is to say, a difference between the diagnostic motor current detection value Is and the maximum current detection value Ix is calculated (Step S24), and then it is determined whether the difference between the diagnostic motor current detection value Is and the maximum current detection value Ix is equal to or more than a given value γ or not (Step s25).

In the above determinations (a), (b) and (c), in the case that all of the above differences are smaller than respective given values, it is determined that all of the above determinations are normal (Step S26).

And then, in the above determinations (a), (b) and (c), in the case that each difference becomes equal to or more than respective given value, a determination of abnormal position is performed (Step S30). That is to say, in the case that the determination (a) is abnormal, the determination (b) is abnormal and the determination (c) is normal, it is determined that the controlling motor current detection value Im is abnormal. Further, in the case that the determination (a) is normal, the determination (b) is abnormal and the determination (c) is abnormal, it is determined that the diagnostic motor current detection value Is is abnormal. Still further, in the case that the determination (a) is abnormal, the determination (b) is normal and the determination (c) is abnormal, it is determined that the maximum current detection value Ix is abnormal. Since the maximum current detection circuit 140 is connected to the output stage of the diagnostic motor current detection circuit 130, in the case that the failure of the diagnostic motor current detection circuit 130 occurs, there is a possibility that the maximum current detection value Ix also becomes an abnormal output. In that case, the determination (a) becomes abnormal, the determination (b) becomes abnormal, and the determination (c) becomes abnormal.

In the above determinations (a), (b) and (c), in the case of determining that only the controlling motor current detection value Im is abnormal (i.e. the determination (a) is abnormal, the determination (b) is abnormal, and the determination (c) is normal), the controlling motor current detection value Im is not used for current control of the motor, the current control is continued by an open loop as a backup control (Step S32), and the assist control is continued (Step S33). Otherwise, since there is a possibility that the trouble of the maximum current detection circuit 140 occurs, and there is a high possibility of becoming impossible to detect the failure of the inverter, the process is returned to the above Step S10, the current control is stopped (Step S11), and then the assist control is stopped (Step S12).

Figure 10:
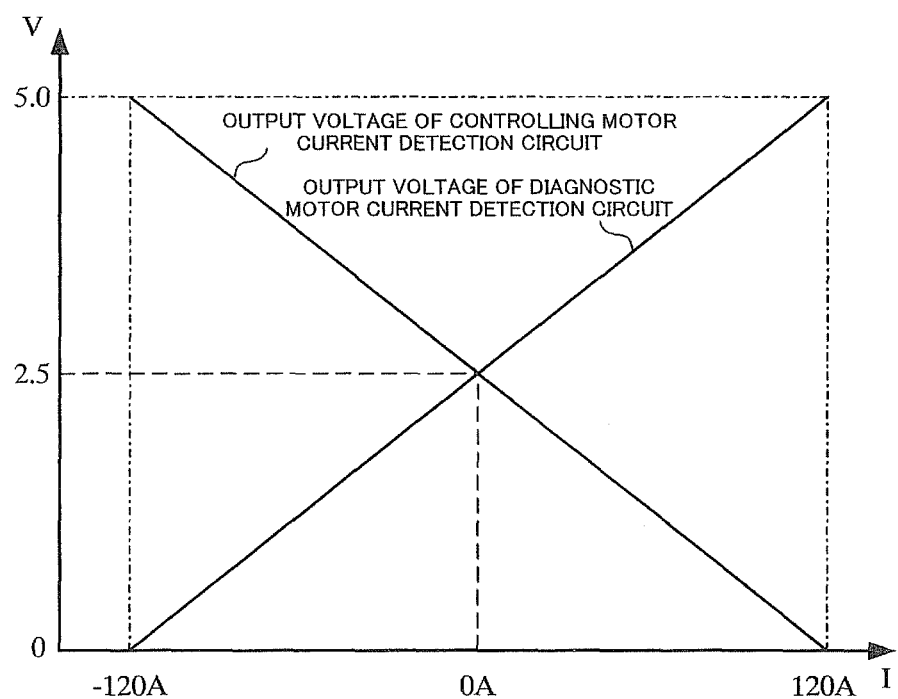
FIG. 10 is a diagram for illustrating other abnormality detection method.

As other abnormality detection method, since the sum of the output voltage of the controlling motor current detection circuit 120 and the output voltage of the diagnostic motor current detection circuit 130 becomes a constant value (5V) shown in FIG. 10 at the time of being normal, for example, if the sum of the output voltage of the controlling motor current detection circuit 120 and the output voltage of the diagnostic motor current detection circuit 130 is equal to or more than "5.3V", or is equal to or less than "4.7V", it is possible to determine that there is an abnormality.

Further, all of the controlling motor current detection circuit 120, the diagnostic motor current detection circuit 130 and the maximum current detection circuit 140 are not limited to the configuration of FIG. 7, a configuration having the same function and effect can be used for the controlling motor current detection circuit 120, the diagnostic motor current detection circuit 130 and the maximum current detection circuit 140. Moreover, although in the above-described embodiments, a three-phase motor is described, in the same way, it is possible to apply the present invention to a motor having a different number of phases such as a two-phase motor. Further, although in the above-described embodiments, an electric power steering apparatus provided with a compensation section, the compensation section is not necessarily required.

EXPLANATION OF REFERENCE NUMERALS 1 handle (steering wheel)
2 column shaft (steering shaft)
10 torque sensor
12 velocity sensor
20 motor
100 control unit
101 current command value calculating section
103 current limiting section
104 current control section
105 PWM control section
105A duty calculating section
106 inverter
106A current detector
110 compensation section
120 current detection circuit (controlling motor current detection circuit)
121, 131 operational amplifier (differential amplifying circuit)
122 A/D conversion section
130 diagnostic motor current detection circuit
140 maximum current detection circuit

The invention claimed is:

1. An electric power steering apparatus that calculates a current command value based on a steering torque and a velocity, drives a motor having a plurality of phases based on said current command value through an inverter comprised of an FET bridge, and performs an assist control of a steering system by drive control of said motor, comprising:
a shunt resistor that is connected to said inverter;
a controlling motor current detection circuit that is connected to two terminals of said shunt resistor in a positive direction, detects phase currents of said motor and uses said detected phase current as a controlling motor current detection value of said assist control;
a diagnostic motor current detection circuit that is connected to two terminals of said shunt resistor in an opposite direction and detects a failure of said controlling motor current detection circuit; and
a maximum current detection circuit that is connected to an output stage of said diagnostic motor current detection circuit, and holds a peak of a diagnostic motor current detection voltage outputted from said diagnostic motor current detection circuit during a constant time, and
wherein each phase current of said motor is detected by one-shunt type and said assist control is performed, and two systems of a circuit for amplifying a voltage between two terminals of said shunt resistor are provided,
wherein a first difference between a controlling motor current detection value detected by said controlling motor current detection circuit and a diagnostic motor current detection value detected by said diagnostic motor current detection circuit is calculated,
wherein when said first difference is equal to or more than a first predetermined value, it is judged that a failure of either one of said controlling motor current detection circuit or said diagnostic motor current detection circuit occurs, and when said first difference is less than said first predetermined value, a maximum current detection value detected by said maximum current detection circuit is inputted and watched,
wherein when said maximum current detection value is equal to or more than a second predetermined value, it is judged that an eddy current failure of said inverter occurs, and when said maximum current detection value is less than said second predetermined value, a predetermined judgment is performed based on said controlling motor current detection value, said diagnostic motor current detection valued and said maximum current detection value,
whereby a failure of said controlling motor current detection circuit, said diagnostic motor current detection circuit or said maximum current detection circuit is diagnosed.

2. An electric power steering apparatus according to claim 1, wherein said predetermined judgment comprising:
a judgment A that a second difference between said maximum current detection value and said controlling motor current detection value is calculated, it is judged whether said second difference is equal to or more than a predetermined value $\alpha$ or not, then it is judged as an abnormality when said second difference is equal to or more than a predetermined value $\alpha$, and it is judged as a normality when said second difference is less than said predetermined value $\alpha$,
a judgment B that a third difference between said controlling motor current detection value and said diagnostic motor current detection value is calculated, it is judged whether said third difference is equal to or more than a predetermined value $\beta$ or not, then it is judged as an abnormality when said third difference is equal to or more than said predetermined value $\beta$, and it is judged as a normality when said third difference is less than said predetermined value $\beta$, and
a judgment C that a forth difference between said diagnostic motor current detection value and said maximum current detection value is calculated, it is judged whether said forth difference is equal to or more than a predetermined value $\gamma$ or not, then it is judged as an abnormality when said forth difference is equal to or more than said predetermined value $\gamma$, and it is judged as a normality when said forth difference is less than said predetermined value $\gamma$.

3. An electric power steering apparatus according to claim 2, wherein
when all of said judgment A, said judgment B and said judgment C are judged as said abnormality, all of said controlling motor current detection circuit, said diagnostic motor current detection circuit and said maximum current detection circuit are diagnosed as said normality,
when said judgment A and said judgment B are judged as said abnormality and said judgment C is judged as said normality, it is diagnosed that said controlling motor current detection circuit is failure, by judging that said controlling motor current detection value is abnormal,
when said judgment A is judged as said normality and said judgment B and said judgment C are judged as said abnormality, it is diagnosed that said diagnostic motor current detection circuit is failure, by judging that said diagnostic motor current detection value is abnormal, and
when said judgment A and said judgment C are judged as said abnormality and said judgment B is judged as said normality, it is diagnosed that said maximum current detection circuit is failure, by judging that said maximum current detection value is abnormal.

4. An electric power steering apparatus according to claim 3, wherein,
when only said controlling motor current detection value is judged as the abnormality in accordance with judgment results of said judgment A, said judgment B and said judgment C, said controlling motor current detection value is not used for a current detection of said motor, a current control is continued with an open loop as a backup control and said assist control is continued.

5. An electric power steering apparatus according to claim 3, wherein said maximum current detection circuit is comprised of a transistor for a peak-hold, and a resistor and a capacitor that generate a charge/discharge time constant,
wherein an output of said diagnostic motor current detection is inputted into a base of said transistor and a charging resistor is inserted between an emitter of said transistor, and said resistor and said capacitor.

6. An electric power steering apparatus according to claim 2, wherein said maximum current detection circuit is comprised of a transistor for a peak-hold, and a resistor and a capacitor that generate a charge/discharge time constant,
wherein an output of said diagnostic motor current detection is inputted into a base of said transistor and a charging resistor is inserted between an emitter of said transistor, and said resistor and said capacitor.

7. An electric power steering apparatus according to claim 2, wherein said diagnostic motor current detection circuit is constituted so that an output voltage of said diagnostic motor current detection circuit increases in accordance with a magnitude of a current when flowing from a power supply side to a ground side based on a voltage when said current which flows through said shunt resistor is zero.

8. An electric power steering apparatus according to claim 2, wherein said controlling motor current detection circuit is constituted so that an output voltage of said controlling motor current detection circuit decreases in accordance with a magnitude of a current when flowing from a power supply side to a ground side based on a voltage when said current which flows through said shunt resistor is zero.

9. An electric power steering apparatus according to claim 8, wherein a sum of a controlling motor current detection voltage detected by said controlling motor current detection circuit and said diagnostic motor current detection voltage detected by said diagnostic motor current detection circuit becomes a constant voltage regardless of said current at a time of being normal.

10. An electric power steering apparatus according to claim 1, wherein said maximum current detection circuit is comprised of a transistor for a peak-hold, and a resistor and a capacitor that generate a charge/discharge time constant,
wherein an output of said diagnostic motor current detection is inputted into a base of said transistor and a charging resistor is inserted between an emitter of said transistor, and said resistor and said capacitor.

11. An electric power steering apparatus according to claim 1, wherein said diagnostic motor current detection circuit is constituted so that an output voltage of said diagnostic motor current detection circuit increases in accordance with a magnitude of a current when flowing from a power supply side to a ground side based on a voltage when said current which flows through said shunt resistor is zero.

12. An electric power steering apparatus according to claim 1, wherein said controlling motor current detection circuit is constituted so that an output voltage of said controlling motor current detection circuit decreases in accordance with a magnitude of a current when flowing from a power supply side to a ground side based on a voltage when said current which flows through said shunt resistor is zero.

13. An electric power steering apparatus according to claim 12, wherein a sum of a controlling motor current detection voltage detected by said controlling motor current detection circuit and said diagnostic motor current detection voltage detected by said diagnostic motor current detection circuit becomes a constant voltage regardless of said current at a time of being normal.

* * * * *